(12) United States Patent
Yamaguchi et al.

(10) Patent No.: US 7,232,716 B2
(45) Date of Patent: Jun. 19, 2007

(54) DISPLAY DEVICE AND METHOD FOR MANUFACTURING THE SAME

(75) Inventors: Hironaru Yamaguchi, Yokohama (JP); Kiyoshi Ogata, Tokyo (JP); Takuo Tamura, Yokohama (JP); Jun Gotoh, Mobara (JP); Masakazu Saito, Mobara (JP); Kazuo Takeda, Tokorozawa (JP)

(73) Assignee: Hitachi Displays, Ltd., Chiba-ken (JP)

( * ) Notice: Subject to any disclaimer, the term of this patent is extended or adjusted under 35 U.S.C. 154(b) by 96 days.

(21) Appl. No.: 10/891,522

(22) Filed: Jul. 15, 2004

(65) Prior Publication Data

US 2005/0142701 A1  Jun. 30, 2005

(30) Foreign Application Priority Data

Dec. 25, 2003 (JP) ............................ 2003-428928

(51) Int. Cl.
*H01L 21/66* (2006.01)
*H01L 21/268* (2006.01)

(52) U.S. Cl. .................... 438/166; 438/487; 438/7; 257/70; 257/E21.53; 257/E21.412

(58) Field of Classification Search ............... 438/166, 438/16, 7, 487; 257/70, E21.412, E21.53; 356/30; 349/43
See application file for complete search history.

(56) References Cited

U.S. PATENT DOCUMENTS

| 5,372,836 A | * | 12/1994 | Imahashi et al. ............ 438/5 |
| 6,059,873 A | * | 5/2000 | Yamaguchi et al. ........... 117/7 |
| 6,080,236 A | * | 6/2000 | McCulloch et al. ........... 117/4 |
| 6,218,198 B1 | * | 4/2001 | Imao et al. ................... 438/7 |
| 6,411,906 B1 | * | 6/2002 | Goto ........................... 702/28 |
| 2002/0059896 A1 | * | 5/2002 | Yamaguchi et al. ........... 117/7 |
| 2002/0066931 A1 | * | 6/2002 | Tamura et al. .............. 257/359 |
| 2002/0160586 A1 | * | 10/2002 | Wada et al. ................ 438/509 |
| 2003/0016349 A1 | * | 1/2003 | Tsumura et al. ......... 356/237.2 |
| 2003/0027410 A1 | * | 2/2003 | Matsumura et al. ........ 438/487 |
| 2003/0036251 A1 | * | 2/2003 | Mitsuhashi et al. ......... 438/487 |

(Continued)

FOREIGN PATENT DOCUMENTS

JP          10-294289          4/1997

(Continued)

*Primary Examiner*—B. William Baumeister
*Assistant Examiner*—Steven J. Fulk
(74) *Attorney, Agent, or Firm*—Reed Smith LLP; Stanley P. Fisher, Esq.; Juan Carlos A. Marquez, Esq.

(57) ABSTRACT

The average film thickness of an amorphous silicon film formed on a substrate is measured. Then, the amorphous silicon film is irradiated with a laser beam to form a polysilicon film, and the grain size distribution of the polysilicon film is measured. An optimum value of energy density of laser beam irradiation is calculated on the basis of grain size values measured at two points A and B of the polysilicon film. Then, the average film thickness of an amorphous silicon film formed on a subsequent substrate is measured. A value of energy density of laser beam irradiation for the subsequent amorphous silicon film is calculated on the basis of the two average film thicknesses. Accordingly, a uniform polysilicon film of large grain sizes is formed on the whole surface of a large-size substrate to provide polysilicon TFTs in a large area.

11 Claims, 10 Drawing Sheets

U.S. PATENT DOCUMENTS

2003/0064571 A1* 4/2003 Takeda et al. .............. 438/488
2004/0061149 A1* 4/2004 Jyumonji et al. ........... 257/268
2005/0199597 A1* 9/2005 Tsao et al. ............. 219/121.66

FOREIGN PATENT DOCUMENTS

| JP | 2003-109902 | 10/2001 |
|---|---|---|
| JP | 2003-203863 | 1/2002 |
| KR | 1999-020745 | 8/1997 |

* cited by examiner

CRYSTAL GRAIN SIZE

ENERGY DENSITY OF LASER BEAM IRRADIATION

ENERGY DENSITY OF LASER BEAM IRRADIATION

ENERGY DENSITY OF LASER BEAM IRRADIATION

DISPLAY DEVICE AND METHOD FOR MANUFACTURING THE SAME

BACKGROUND OF THE INVENTION

The present invention relates to a display device provided with a semiconductor device (such as a thin-film transistor (TFT)) and a method for manufacturing the same.

As an active layer of a thin-film transistor (TFT) serving as a driver in a liquid crystal display device, a polycrystalline semiconductor film is superior to an amorphous semiconductor film because the polycrystalline semiconductor film is so high in mobility of carrier (electrons in an n channel or holes in a p channel) that both small cell size and high resolution can be attained.

An ordinary polycrystalline silicon TFT needs to be subjected to a high-temperature process at a temperature of 1,000° C. or higher. On the other hand, in a low-temperature polycrystalline semiconductor production technique in which only a semiconductor layer is annealed by a laser so that a substrate is not exposed to a high temperature, a TFT high in mobility can be formed in a low-temperature process in which an inexpensive substrate can be used.

In the laser annealing, an amorphous silicon film 71 as a precursor film formed on a substrate 7 of a liquid crystal display device is scanned while irradiated with a laser beam 11 absorbable to the amorphous silicon film 71 as shown in FIG. 2. As a result, the whole surface of the amorphous silicon film on the substrate is polycryallized to form a polycrystalline silicon film 72. Incidentally, another amorphous semiconductor film may be used as the precursor film.

As shown in FIG. 3, the grain size of the polycrystalline silicon changes (from regions R1 to R5) according to the energy density (fluence) of laser beam irradiation. Accordingly, laser stability is reflected in the grain size distribution of the polycrystalline silicon. The carrier mobility of the polycrystalline silicon film increases as the grain size of the polycrystalline silicon increases. It is therefore necessary to keep the grain size distribution uniform and keep the grain size large so that high-performance TFT characteristic uniform in a plane can be obtained.

The grain size will be kept large if the energy density of the region R4 in FIG. 3 can be used. When the energy density however changes to a higher one because of instability of laser beam irradiation, a region containing microcrystal having a grain size of not larger than 200 nm is used as represented by the region R5. In this case, carrier mobility is reduced to cause a device failure.

The grain size changes not only according to the energy density of laser beam irradiation but also according to variation in film thickness of the amorphous silicon before laser annealing. Accordingly, the instability of laser beam irradiation and the influence of variation in film thickness on the substrate must be suppressed so that a polycrystalline silicon film with a grain size always kept in a predetermined grain size range can be produced. It is therefore important to inspect the grain size of the polycrystalline silicon, feed the result of inspection back to the laser annealing condition and control the grain size of the polycrystalline silicon to be kept constant.

A technique concerning the method for controlling the energy density of laser beam irradiation at laser annealing has been described in JP-A-10-294289. The technique is as follows. The degree of orientation of crystal in a crystallized thin film is measured with an orientation analyzer. A judgment is made on the basis of a result of the measurement as to whether the energy density of laser beam irradiation is either too much or too little. A laser beam output is adjusted on the basis of the judgment.

A technique for evaluating the grain size of the polycrystalline silicon by measuring a light diffraction pattern and feeding the evaluated grain size back to the laser annealing process has been described in JP-A-2003-109902.

SUMMARY OF THE INVENTION

A substrate having a size not smaller than 730 mm by 920 mm has been used recently in order to improve throughput of production. A silicon film is formed on the substrate in such a manner that amorphous silicon is first formed by a CVD method and then polycrystallized by laser beam irradiation. Ununiformity in film thickness is caused by ununiformity in plasma at the time of film production by the CVD method. The energy density required for crystallization of a silicon film varies according to the variation in film thickness, so that the crystal grain size varies according to a location in the substrate surface.

In the background art, however, there is no consideration of ununiformity in film thickness in a plane. Defective portions in which the crystal grain size is out of the range R4 in FIG. 3 can be hardly prevented from being produced in a plane of the substrate.

In the background art, a long time is taken when a substrate having a large size such as 730 mm by 920 mm is entirely scanned with measurement light to inspect the crystalline state of the whole surface of the substrate. If this inspection is performed whenever one substrate is annealed, a time loss is generated until the result of the inspection is fed back to a following substrate. This is a barrier to improvement in production capacity.

If the intensity of the laser beam is either too much or too little compared with the optimum crystallization condition, the grain size becomes smaller. It is difficult to judge whether the intensity of the laser beam is to be increased or to be decreased.

Because the margin of the region R4 in FIG. 3 is narrow, it is difficult to set the energy density of laser beam irradiation so that the grain size of the whole of the substrate surface is in the range R4. It is therefore necessary to obtain the set value of the energy density of laser beam irradiation quantitatively and accurately. In the background art, however, there is no description on this point.

In the background art, the energy density of laser beam irradiation for crystallizing a silicon film is merely adjusted on the basis of the crystalline state of a silicon film which has been already crystallized. There is no consideration given to the thought that change in energy density of laser beam irradiation is predicted in accordance with variation in film thickness in advance to prevent a bad crystalline film from being produced.

A first object of the present invention is to provide a method for setting the energy density of laser beam irradiation to prevent the crystal grain size in any place of the substrate surface from being out of the range R4 in FIG. 3.

A second object of the invention is to shorten the time required for inspecting the crystal grain size distribution of the silicon film on one substrate to thereby shorten the time required for feeding the result of the inspection back to a following substrate.

A third object of the invention is to provide judgment means as to whether the energy density of laser beam irradiation is to be increased or to be decreased when a defective product small in crystal grain size is produced.

A fourth object of the invention is to obtain the set value of the energy density of laser beam irradiation quantitatively to keep the crystal grain size on the whole surface of the large substrate.

A fifth object of the invention is to predict the energy density of laser beam irradiation in accordance with variation in film thickness to thereby prevent a bad crystalline film from being produced.

To achieve the first object, the energy density of laser beam irradiation is adjusted on the basis of the difference between grain sizes measured in grain size monitor regions provided in a plurality of places which are in a substrate surface and which are easily affected by change in energy density of laser beam irradiation.

To achieve the second object, crystal grain size measurement points are limited to a plurality of points in the monitor regions so that the energy density of laser beam irradiation is adjusted on the basis of crystal grain sizes measured at these points.

To achieve the third object, the amount of change in energy density of laser beam irradiation is calculated on the basis of the difference between grain sizes measured in the grain size monitor regions.

To achieve the fourth object, correlation functions each expressing a correlation between the energy density of laser beam irradiation and the crystal grain size are obtained at the sampling points respectively and used in combination so that the quality of crystal on the whole surface of the substrate is fed back to the energy density of laser beam irradiation.

To achieve the fifth object, the step of measuring the film thickness distribution of a film before laser beam irradiation is provided so that the energy density of laser beam irradiation can be decided in accordance with every plane and every substrate on the basis of the film thickness distribution.

According to the invention, in a process of manufacturing low-temperature polysilicon TFTs, control can be made easily so that the grain size can be kept large on the whole surface of the substrate. Both yield and production efficiency can be improved.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Embodiments of the invention will be described below with reference to the drawings. Although each embodiment will be described on the case where the invention is applied to a liquid crystal display device by way of example, the invention is not limited to the liquid crystal display device but may be applied to another display device such as a self-luminous organic electroluminescence display device as long as the transistor according to the invention can be used as a switching device in the display device.

[First Embodiment]

Figure 1:
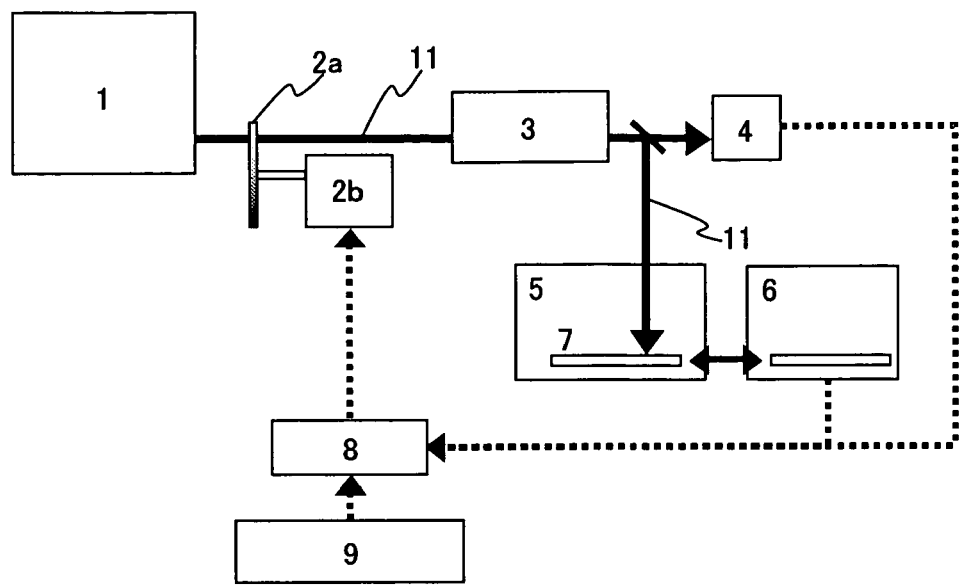
FIG. 1 is a block diagram for explaining the apparatus configuration of a laser beam irradiation apparatus according to the invention.
Figure 2:
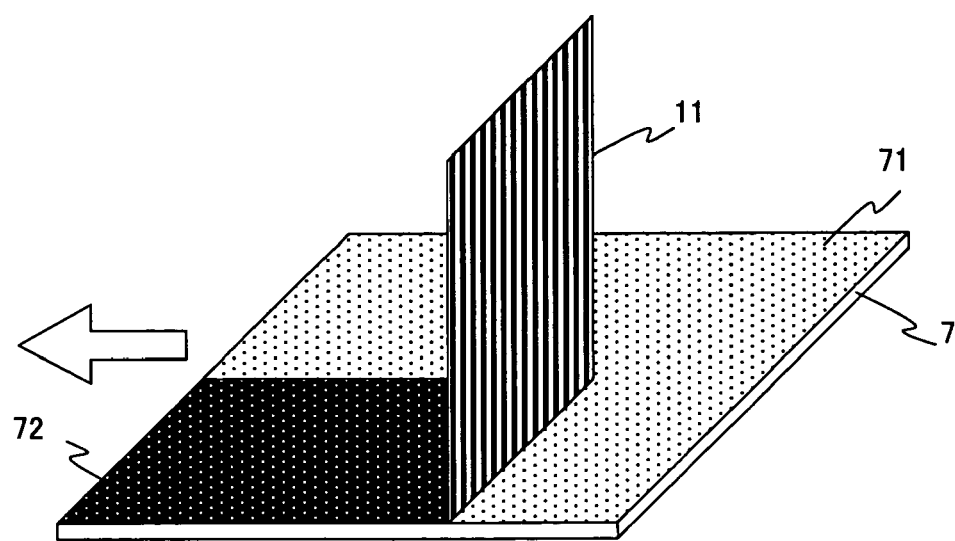
FIG. 2 is an explanatory view conceptually showing the outline of the method of annealing the silicon film on a substrate.
Figure 3:
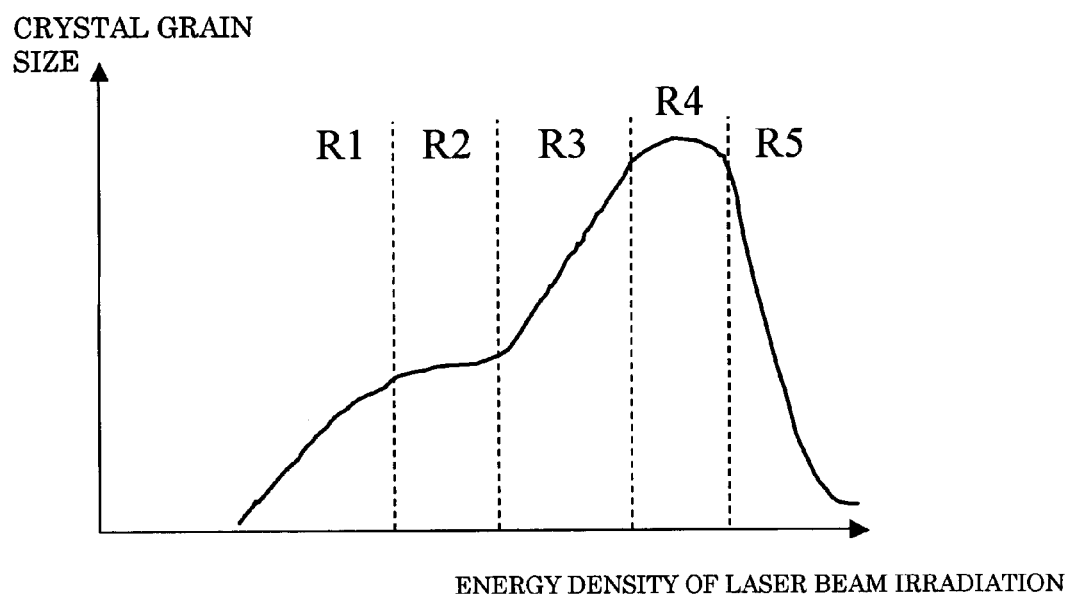
FIG. 3 is a correlation graph for explaining the relation between the energy density of laser beam irradiation and the crystal grain size.
Figure 4:
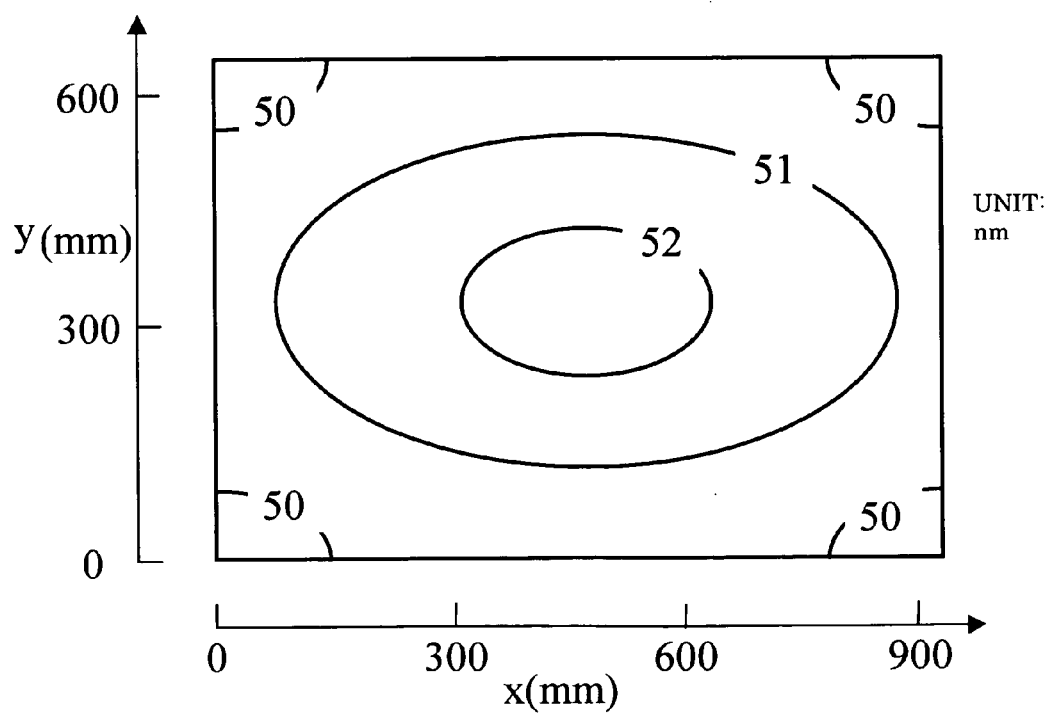
FIG. 4 is an explanatory graph showing an example of the film thickness distribution of a silicon film formed on a substrate.

A first embodiment of the invention will be described with reference to FIGS. 1 to 4, FIGS. 5A to 5C and FIG. 6. FIG. 1 is a diagram showing the configuration of the invention. FIG. 2 is a schematic view showing annealing of a silicon film on the substrate. FIG. 3 shows the correlation between the energy density of laser beam irradiation and the crystal grain size. FIG. 4 shows an example of the film thickness distribution of a silicon film formed on the substrate. FIGS. 5A to 5C show the crystal grain size distribution in the case where the silicon film depicted in FIG. 4 is annealed by laser beam irradiation while the energy density of laser beam irradiation is changed variously. FIG. 6 is a correlation graph for explaining the relation between the energy density of laser beam irradiation and the crystalline state in accordance with each location on the substrate. The first embodiment will be described below in detail.

In FIG. 1, the reference numeral 1 designates a laser beam source; 2a, a variable attenuator; 2b, an attenuator controller; 11, a laser beam; 3, an optical system; 4, a photo sensor; 5, an anneal chamber as an annealer; 6, a grain size distribution monitor as a grain size measuring portion; 7, a substrate used in a liquid crystal display device; 8, a control computer; and 9, a film thickness measuring portion. Though not shown in FIG. 1, a carrying mechanism is provided for carrying the substrate 7 between the annealer 5 and the grain size measuring portion 6.

The laser beam 11 emitted from the laser beam source 1 is applied on the substrate 7 after shaped into a beam necessary for crystallization of silicon by the optical system 3. For example, an XeCl excimer laser with a wavelength of 308 nm is used as the laser beam source 1. Incidentally, the beam emitted from the excimer laser may be replaced by a beam emitted from another laser such as a solid state laser.

The variable attenuator 2a is used for controlling the intensity of the laser beam. For example, the variable attenuator 2a is formed in such a manner that a film exhibiting light transmittance varying according to the angle of rotation is formed on a glass disk. The value of transmittance designated by the control computer 8 is converted into a value of rotation angle by the attenuator controller 2b to control the variable attenuator 2a to thereby control the energy density of laser beam irradiation.

For example, a homogenizer for shaping the beam into a rectangular beam uniform in intensity is used as the optical system 3. The laser beam output from the optical system 3 is monitored by the photo sensor 4 to judge whether the shape and intensity of the laser beam are in a desired state or not. For example, a CCD camera is used as the photo sensor 4.

After completion of polycrystallization, the substrate 7 is automatically carried from the anneal chamber 5 to the grain size distribution monitor 6 in which the grain size distribution of the polycrystalline film is measured. When a result of the measurement is sent to the control computer 8 to control the variable attenuator 2a, the result of the measurement is fed back to the intensity of laser beam irradiation. The respective members shown in FIG. 1 are sequentially controlled by the control computer 8 so that the silicon film on the substrate 7 can be annealed automatically.

FIG. 2 shows a state in which the substrate 7 is irradiated with the laser beam 11. In FIG. 2, the reference numeral 71 designates a region of an amorphous silicon film as a precursor film; and 72, a region of a polycrystalline silicon (polysilicon) film as a polycrystalline semiconductor film. Although this embodiment shows the case where the substrate 7 has a size generally used, that is, 920 mm in a horizontal direction and 730 mm in a direction vertical to the horizontal direction, the size of the substrate 7 is not limited thereto. When the substrate 7 is scanned in the direction of the arrow in FIG. 2 while irradiated with the rectangular laser beam 11, laser beam irradiation can be performed on the whole surface of the substrate 7. The size of the laser beam 11 is 300 µm in a horizontal direction and 365 mm in a direction vertical to the horizontal direction in FIG. 2. When the laser beam 11 is moved in the widthwise direction on one half area and another half area of the substrate 7, the polysilicon film region 72 can be generated on the whole surface of the substrate 7.

In the invention, as shown in FIG. 1, the grain size distribution monitor 6 is set so that the crystal grain size distribution is measured whenever annealing of the substrate 7 is completed. The result of the measurement of the crystal grain size distribution and the result of the measurement in the film thickness measuring portion 9 are input to the control computer 8 and compared with each other to calculate the energy density of laser beam irradiation required for obtaining an optimum crystal grain size distribution and feed the calculated value of the energy density back to the variable attenuator 2a. A technique described in JP-A-2003-109902, that is, a method of obtaining the grain size on the basis of the intensity of light diffraction from the polysilicon film is used in the grain size distribution monitor 6. Incidentally, the crystal grain size can be obtained even in the case where a Raman spectrum, an SEM image, an optical microscopic image, light reflectance, the intensity of light scattering or the life of a photo carrier is used in place of the intensity of light diffraction. Also in this case, the same result as described above can be obtained.

The feedback method will be described below in detail. FIG. 3 shows the correlation between the energy density of laser beam irradiation and the crystal grain size. The correlation has been described in the background art. FIG. 4 shows an example of the film thickness distribution of the amorphous silicon film measured by the film thickness measuring portion 9 shown in FIG. 1 before polycrystallization after the amorphous silicon film is formed by a CVD method. The size of the substrate 7 is the same as shown in FIG. 2. That is, the substrate 7 is 920 mm in the horizontal direction x and 730 mm in the vertical direction y. Lines shown in FIG. 4 are contour lines connecting isopachous places. The numerical value given to each isopachous line shows a film thickness expressed in nm. In this example, the average film thickness is 51 nm, and the standard deviation s of the film thickness distribution is 0.9 nm. The central portion of the substrate exhibits a large film thickness and the peripheral portion of the substrate exhibits a small film thickness because the plasma density of a CVD chamber is not uniform. The film thickness distribution is not limited to the example shown in FIG. 4 because the film thickness distribution is generally exhibited as a shape peculiar to each CVD chamber.

FIGS. 5A to 5C show the crystal grain size distribution as a result of annealing of the silicon film on the substrate shown in FIG. 4 by laser beam irradiation. The horizontal and vertical axes in FIGS. 5A to 5C are the same as those in FIG. 4. The energy density of laser beam irradiation is the highest in FIG. 5A and decreases in order of FIG. 5B and FIG. 5C. As represented by the scale in the left side, the white portion expresses a portion large in grain size, the hatched portion expresses a portion slightly small in grain size, and the black portion expresses a portion small in grain size. In FIG. 5A in which the energy density of laser beam irradiation is high, the central portion of the substrate having a large film thickness is large in grain size whereas the peripheral portion of the substrate having a small film thickness is small in grain size. In FIG. 5B, both the central portion and the peripheral portion of the substrate are large in grain size. In FIG. 5C, the peripheral portion of the substrate is large in grain size whereas the central portion of the substrate is small in grain size.

Generally, this phenomenon occurs because the energy density required for crystallization increases as the film thickness increases. It is known that when the film thickness of silicon changes by 1 nm, the energy density required for crystallization of the silicon changes by about 1%.

As is obvious from FIG. 3, the crystal grain size becomes smaller if the energy density of laser beam irradiation is either too high or too low compared with the energy density required for crystallization with the grain size kept large. That is, in FIG. 5A, the crystal grain size in the peripheral portion small in film thickness becomes smaller because the energy density of laser beam irradiation applied on the peripheral portion is too high. In FIG. 5C, the crystal grain size in the central portion large in film thickness becomes smaller because the energy density of laser beam irradiation applied on the central portion is too low.

FIG. 6 shows this phenomenon graphically. In FIG. 6, the reference numeral 21 designates a correlation between the energy density of laser beam irradiation and the crystal grain size in the central portion (white portion) of the substrate in FIG. 5A; 22, a correlation between the energy density of laser beam irradiation and the crystal grain size in the portion (hatched portion) around the central portion in FIG. 5A; and 23, a correlation between the energy density of laser beam irradiation and the crystal grain size in the corner portion (black portion) of the substrate in FIG. 5A. The shape of each correlation is the same as the shape shown in FIG. 3 but shifts to left and right, that is, in a direction of the energy density of laser beam irradiation in accordance with the film thickness.

Accordingly, for example, the grain size distribution after polycrystallization can be classified into three patterns shown in FIGS. 5A to 5C by image recognition. Feedback control is performed in accordance with the obtained pattern so that in the case shown in FIG. 5A, the energy density is reduced from the current value, that in the case shown in FIG. 5B, the energy density is kept at the current value, and that in the case shown in FIG. 5C, the energy density is increased from the current value. Incidentally, because amorphous silicon films formed on substrates respectively by use of one CVD chamber have film thickness distributions substantially equal to each other on the substrates, the same image recognition algorithm for judging the grain size distribution may be applied to all the substrates.

Although this embodiment has been described on the case where the grain size distribution is classified into three patterns, feedback control for energy density can be performed more accurately if pattern change in the grain size distribution can be judged more delicately so that the middle between the pattern shown in FIG. 5A and the pattern shown in FIG. 5B or the middle between the pattern shown in FIG. 5B and the pattern shown in FIG. 5C can be distinguished.

According to the aforementioned configuration of the invention, control can be made so that crystal large in grain size can be obtained on the whole surface of the substrate. In addition, a judgment can be made as to whether the energy density of laser beam irradiation is appropriate or either too high or too low, so that the result of the judgment can be fed back to optimize the energy density of laser beam irradiation to be applied on a following substrate.

[Second Embodiment]

Figure 7:
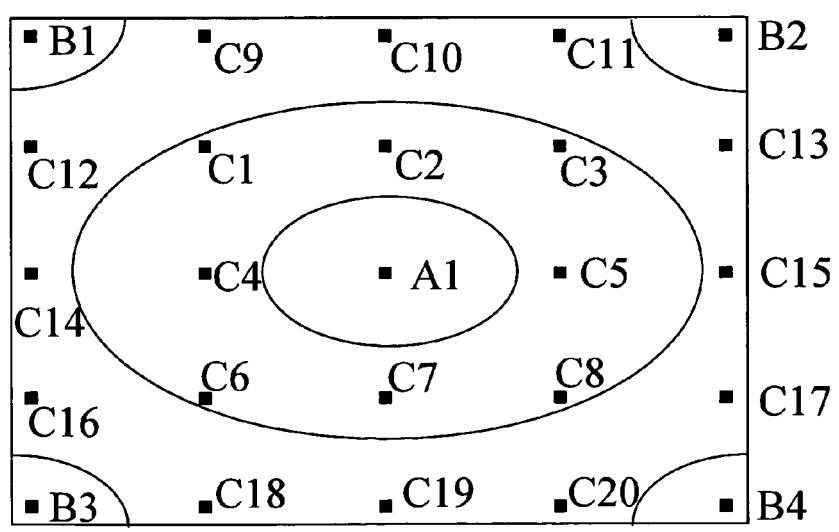
FIG. 7 is a graph of arrangement in the case where the crystal grain size in a plane of the substrate is measured.

A second embodiment of the invention will be described with reference to FIGS. 7 and 8. FIG. 7 is a graph showing arrangement of crystal grain size measurement points set on the substrate depicted in FIG. 4. In FIG. 7, the reference symbols A1, B1 to B4 and C1 to C20 designate crystal grain size measurement points respectively. The point A1 is disposed in a region of amorphous silicon large in film thickness. The points B1 to B4 are disposed in a region of amorphous silicon small in film thickness. The points C1 to C20 are disposed in a region of amorphous silicon intermediate in film thickness. In this embodiment, the grain size is measured at each of crystal grain size measurement points disposed in places expressing the feature of the film thickness distribution instead of image recognition in the first embodiment so that feedback control for the energy density of laser beam irradiation can be performed.

These points can be disposed as follows. For example, the film thickness distribution of amorphous silicon is measured by the film thickness measuring portion 9 before the substrate is put in the anneal chamber 5 in FIG. 1. Crystal grain size measurement points are decided so as to be located in places large in film thickness and in places small in film thickness on the basis of the measured film thickness distribution. In the case where an amorphous silicon film is produced by CVD, the film thickness distribution need not be measured whenever annealing is made because the film thickness distribution on the substrate does not change so much for several days. Accordingly, in this case, the positions of points A1, B1 to B4 and C1 to C20 may be decided on the basis of the result of the film thickness distribution measured on at least one reference substrate.

As shown in FIGS. 5A to 5C, use of the measured result of the film thickness distribution may be replaced by use of a plurality of reference substrates irradiated with laser beams different in energy density for deciding the arrangement of points A1, B1 to B4 and C1 to C20. In this case, the points B1 to B4 are disposed in a region where the grain size is reduced when the energy density is too high (i.e. in the black region in FIG. 5A), while the point A1 is disposed in a region where the grain size is reduced when the energy density is too low (i.e. in the black region in FIG. 5C).

Figure 8:
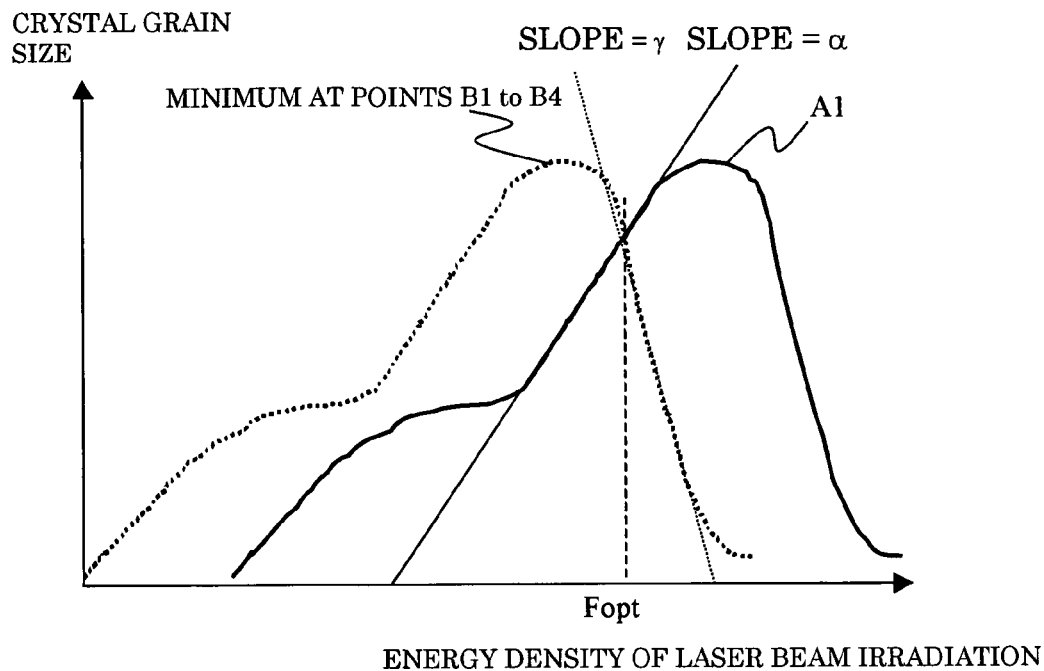
FIG. 8 is a correlation graph for explaining the relation between the crystal grain size and the energy density of laser beam irradiation in accordance with variation in film thickness.

FIG. 8 shows a correlation between the crystal grain size and the energy density of laser beam irradiation at the point A1 or at the points B1 to B4 in FIG. 7. The correlation is obtained in such a manner that the grain size measured at the point A1 or at the points B1 to B4 of each substrate is plotted with respect to the energy density of laser beam irradiation in the condition that 28 substrates are crystallized while the energy density of laser beam irradiation is changed successively from 280 mJ/cm$^2$ to 550 mJ/cm$^2$ at intervals of 10 mJ/cm$^2$. Incidentally, the energy density of laser beam irradiation is measured with the photo sensor 4 shown in FIG. 1. In FIG. 8, the solid line shows the correlation at the point A, and the broken line shows the correlation at the points B1 to B4.

In FIG. 8, the minimum of grain sizes measured at the points B1 to B4 is used in place of the respective grain sizes measured at the points B1 to B4. This is means for making it possible to detect the smallest grain size in each substrate surface even in the case where the energy density is too low, because the order of size concerning the respective grain sizes measured at the points B1 to B4 of each substrate varies according to delicate change of state in the CVD apparatus. Incidentally, the average of the grain sizes may be used in place of the minimum when the order of size concerning the respective grain sizes measured at the points B1 to B4 is not changed so much.

It is apparent from FIG. 8 that the curves shown in FIG. 8 are shaped as if the curve shown in FIG. 3 is shifted to left and right (i.e. in the direction of change in energy density of laser beam irradiation) and superimposed on FIG. 8. It is apparent that this is based on the fact that the energy required for forming crystal with a large grain size at the point A1 is high because the film thickness at the point A1 is larger than the film thickness at the points B1 to B4.

Therefore, a feedback method for setting the energy of laser beam irradiation to keep the crystal grain size large both at the point A1 and at the points B1 to B4 will be described below.

In FIG. 8, the energy density of laser beam irradiation at a point of intersection between the solid line and the broken line is defined as an optimum value Fopt. The following feedback operation is made on the basis of the relation between the grain size at the point A1 and the grain size at the points B1 to B4.
(1) The case where the grain size at the point A1 is smaller than the minimum grain size at the points B1 to B4 corresponds to a region on the left side of Fopt in FIG. 8. Accordingly, because the energy density is too low, feedback control is made to increase the energy density.
(2) The case where the grain size at the point A1 is larger than the minimum grain size at the points B1 to B4 corresponds to a region on the right side of Fopt in FIG. 8. Accordingly, because the energy density is too high, feedback control is made to decrease the energy density.
(3) The case where the grain size at the point A1 is nearly equal to the minimum grain size at the points B1 to B4 corresponds to the position of Fopt in FIG. 8. Accordingly, because the energy density is appropriate, annealing is continued while the energy density is kept as it is.

In this manner, the fact that the energy density is either too high or too low can be grasped from grain sizes measured at several points in the substrate surface without the necessity of measuring grain sizes at all points on the whole surface of the substrate, so that feedback control can be made for the intensity of laser beam irradiation.

When the number of sampling points for measuring the grain size is limited as described above or when sampling points are decided by use of reference substrates as described above, the time required for monitoring the grain size can be shortened. As a result, the time requiring for feeding the measured result back to a following substrate can be shortened, so that production efficiency can be improved.

[Third Embodiment]

A third embodiment of the invention will be described also with reference to FIG. 8. As described above in the second embodiment, FIG. 8 shows correlations between the crystal grain size and the energy density of laser beam irradiation at a place large in film thickness and at a place small in film thickness. In the case where the energy density of laser beam irradiation is out of Fopt, the amount of change (increase or decrease) in energy density of laser beam irradiation to be applied on a following substrate is given by a function of crystal grain size at the point A1 or at the points B1 to B4.

In this embodiment, the correlation between the crystal grain size and the energy density of laser beam irradiation is approximated by a linear function. This is because the correlation between the two is approximately equal to a linear function when the displacement from Fopt is slight. Let $X(A1)$ and $X(B1)$ to $X(B4)$ be grain sizes at the points A1 and B1 to B4 respectively. The correlation between the energy density F of laser beam irradiation and the crystal grain size at each point is approximated linearly at the neighborhood of Fopt as follows.

$$X(A1) = \alpha F + \beta$$

$$X(B1) = \gamma F + \delta_1$$

$$X(B2) = \gamma F + \delta_2$$

$$X(B3) = \gamma F + \delta_3$$

$$X(B4) = \gamma F + \delta_4$$

(These expressions are generically referred to as "expression 1".)

In each of the expressions concerning the points B1 to B4, the slope is defined as $\gamma$ because the slope little depends on the film thickness of silicon. That is, the slopes $\alpha$ and $\gamma$ can be obtained on the basis of results of crystallization of a plurality of reference substrates irradiated with laser beams different in energy density.

A method for obtaining the amount of feedback for the energy density of laser beam irradiation will be described below. Assume that grain sizes at the points A1 and B1 to B4 are $X(A1)$ and $X(B1)$ to $X(B4)$ respectively when a laser beam with certain energy density F is applied. Let $\Delta F$ be the amount of feedback for correcting the energy density of laser beam irradiation to Fopt. The feedback amount $\Delta F$ is given as follows. Let Xopt be a grain size corresponding to Fopt in FIG. 8.

$$\Delta F = Fopt - F$$
$$= \{Xopt - X(A1)\}/\alpha$$
$$= [Xopt - \min\{X(B1), X(B2), X(B3), X(B4)\}]/\gamma$$

(This expression is referred to as "expression 2".)

In the expression 2, min( ) is a function for returning the smallest of arguments.

The expression 2 can be rearranged as follows.

$$\alpha \cdot (Fopt - F) = Xopt - X(A1)$$

$$\gamma \cdot (Fopt - F) = Xopt - \min\{X(B1), X(B2), X(B3), X(B4)\}$$

(These expressions are generically referred to as "expression 3".)

Xopt can be eliminated as follows.

$$\Delta F = [\min\{X(B1), X(B2), X(B3), X(B4)\} - X(A1)]/(\alpha - \gamma)$$

(This expression is referred to as "expression 4".)

That is, when $1/(\alpha - \gamma)$ is replaced by k, the expression 4 can be rearranged as follows.

$$\Delta F = k \cdot [\min\{X(B1), X(B2), X(B3), X(B4)\} - X(A1)]$$

(This expression is referred to as "expression 5".)

Because the slope $\alpha$ is positive while the slope $\gamma$ is negative, k is positive.

When $\min\{X(B1), X(B2), X(B3), X(B4)\}$ is replaced by $X(B)$ while $X(A1)$ is replaced by $X(A)$, the expression 5 can be generalized as follows.

$$\Delta F = k \cdot [X(B) - X(A)]$$

That is, the feedback amount is given by a linear function with respect to grain sizes at points A and B.

That is, in the case where the grain size at the point B small in film thickness is smaller than the grain size at the point A, $\Delta F$ becomes negative. In this case, feedback control is made to decrease the energy density of laser beam irradiation. On the other hand, in the case where the grain size at the point A large in film thickness is smaller than the grain size at the point B, $\Delta F$ becomes positive. In this case, feedback control is made to increase the energy density of laser beam irradiation.

As described above, in accordance with the invention, the optimum energy density for obtaining a polysilicon film having the grain size kept large on the whole surface of a large-size substrate can be calculated quantitatively.

[Fourth Embodiment]

Figure 9:
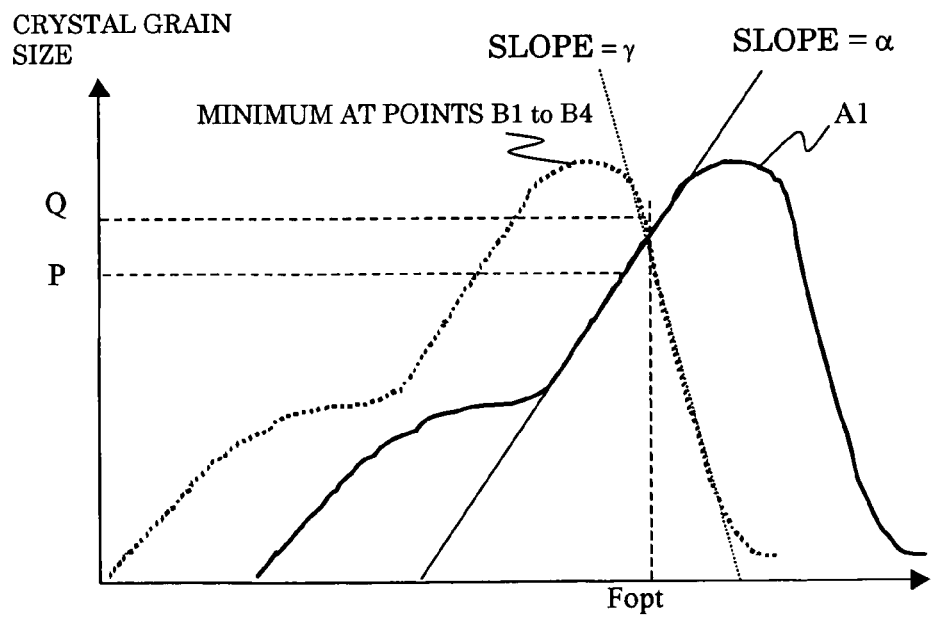
FIG. 9 is an explanatory graph for explaining optimization of the energy density of laser beam irradiation.

A fourth embodiment of the invention will be described with reference to FIGS. 9 and 10. This embodiment is provided so that feedback control can be made more accurately than that in the third embodiment. In FIG. 9, the solid line and the broken line express the same correlations as shown in FIG. 8. In FIG. 9, thresholds P and Q are decided for the solid line (grain size at the point A1) and the broken line (minimum grain size at the points B1 to B4) respectively. For example, the thresholds P and Q are set at 0.4 μm and 0.5 μm respectively.

The reason why Q is set to be larger than P is as follows. The absolute value |γ| of the slope at the points B1 to B4 is larger than the absolute value |α| of the slope at the point A1. Accordingly, the grain size shows a tendency toward reduction when the energy density of laser beam irradiation increases. It is therefore necessary to give a larger margin to the grain size at the point A1. That is, when the grain size at the point A1 is smaller than P, feedback control is made to decrease the energy density, and when the minimum grain size at the points B1 to B4 is smaller than Q, feedback control is made to decrease the energy density.

Algorithm for feedback control will be described below with reference to FIG. 10. The correlation between the energy density and the grain size is approximated by a linear function.

Figure 10:
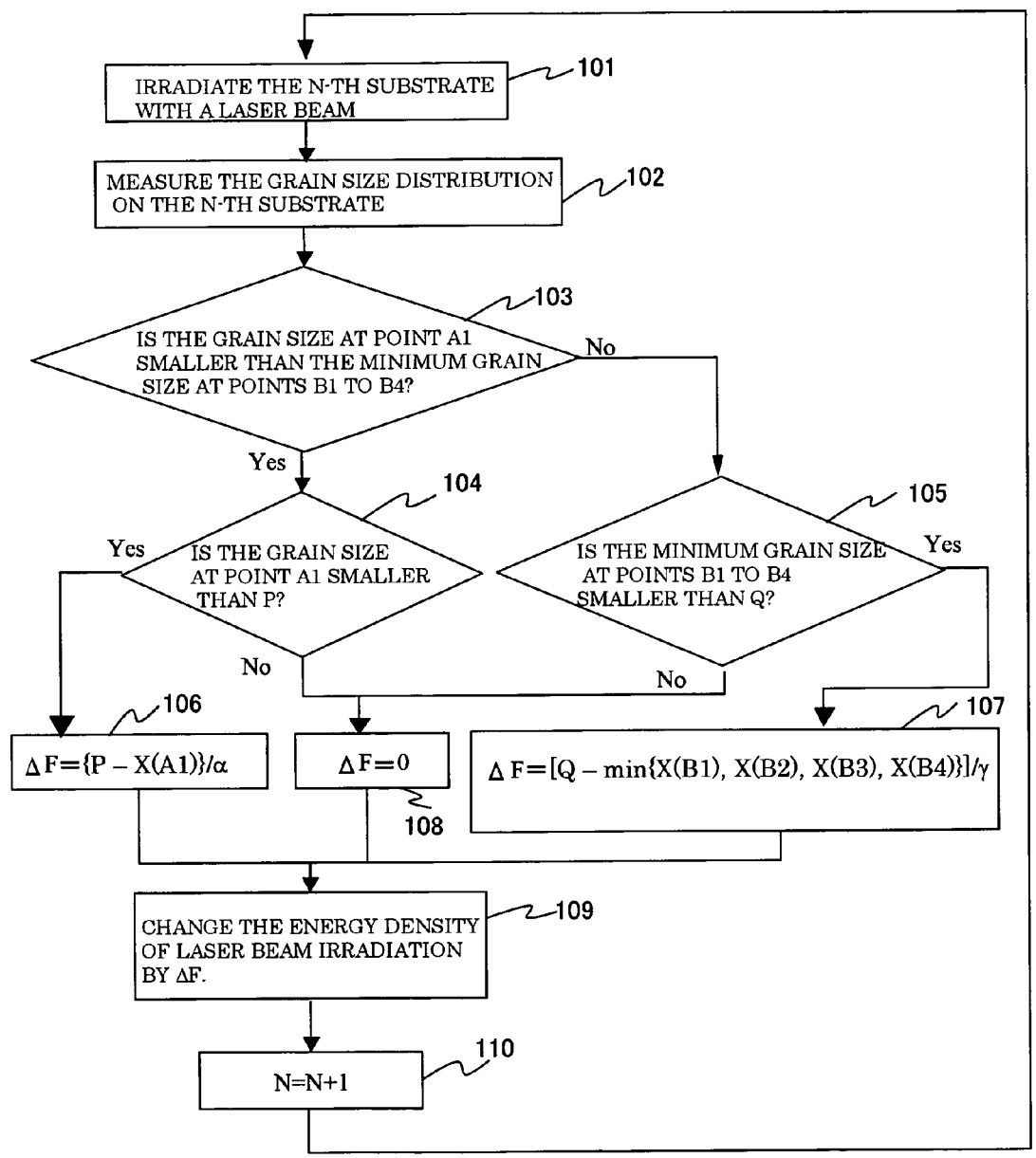
FIG. 10 is a flow chart for explaining algorithm for adjusting the energy density of laser beam irradiation.

In FIG. 10, substrates are one by one led into the annealing chamber 5 shown in FIG. 1 and are irradiated with a beam. That is, the N-th substrate is irradiated with a beam (step 101). After beam irradiation, the substrate is led into the grain size distribution monitor 6 in which the grain size distribution in the substrate surface is measured (step 102). Among data of the grain size distribution, the grain size at the point A1 and the minimum grain size at the points B1 to B4 are compared with each other (step 103), so that the amount of feedback is calculated as follows.

When the grain size at the point A1 is smaller than the minimum grain size at the points B1 to B4 (Yes in step 103) and smaller than P (Yes in step 104), that is, when the energy density is too low, the feedback amount ΔF is given by the following expression (step 106).

$$\Delta F = Fopt - F = \{P - X(A1)\}/\alpha$$

(This expression is referred to as "expression 6".)

In this expression, the slope α is positive. Accordingly, ΔF becomes positive, so that feedback control is made to increase the energy density.

When the minimum grain size at the points B1 to B4 is smaller than the grain size at the point A1 (No in step 103) and smaller than Q (Yes in step 105), that is, when the energy density is too high, the amount of feedback is given by the following expression (step 107).

$$\Delta F = [Q - \min\{X(B1), X(B2), X(B3), X(B4)\}]/\gamma$$

(This expression is referred to as "expression 7".)

In this expression, the slope γ is negative. Accordingly, ΔF becomes negative, so that feedback control is made to decrease the energy density.

When the grain size at the point A1 is not smaller than P (No in step 104) and the minimum grain size at the points B1 to B4 is not smaller than Q (No in step 105), that is, when the energy density is appropriate, the feedback amount ΔF is set at zero (step 108).

After the energy density of laser beam irradiation is changed by the feedback amount ΔF based on the aforementioned result (step 109), a next substrate is irradiated with the beam (steps 110 and 101).

As described above, in accordance with the invention, the optimum energy density for forming a polysilicon film having the crystal grain size kept large on the whole surface of each substrate can be obtained quantitatively.

[Fifth Embodiment]

A fifth embodiment of the invention will be described with reference to FIGS. 11 and 12. This embodiment can be adapted to the case where a region small in grain size still remains in the substrate surface even though feedback control according to any one of the aforementioned embodiments is made.

As an example of this problem, the margin (the width of the range R4 in FIG. 3) of energy density required for increasing the crystal grain size may be narrowed when the number of applied laser beam pulses is reduced to improve throughput of the polycrystallization process. In this case, the grain size is reduced even in a region slightly different in film thickness in the substrate surface.

Therefore, in this embodiment, correction of the energy density due to the film thickness is performed in addition to measures taken in any one of the aforementioned embodiments. FIG. 11 shows the x-direction distribution of y-direction average values of film thicknesses shown in FIG. 4. As shown in FIG. 11, film thicknesses are distributed in the left-right direction of the substrate so that the central portion of the substrate is thicker by about 0.6 nm than each of the left and right end portion of the substrate. As described above, the energy density required for crystallization increases by 1% as the film thickness increases by 1 nm. Accordingly, in this embodiment, the energy density is changed in accordance with the in-plane film thickness distribution in order to obtain uniform crystal in a plane of the substrate.

Figure 12:
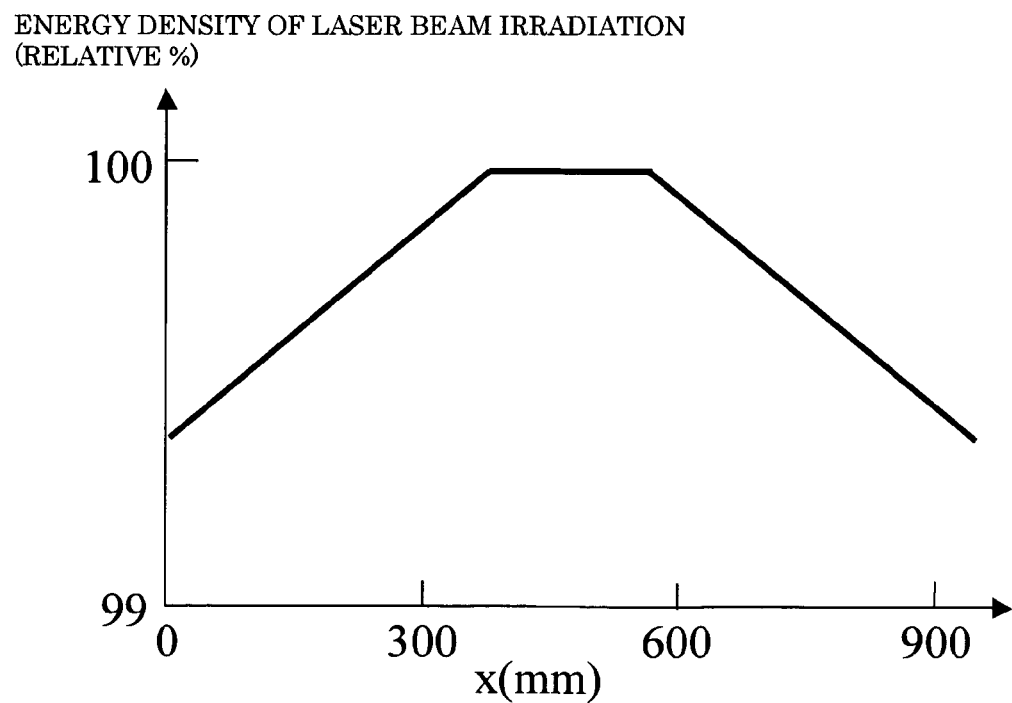
FIG. 12 is a graph for explaining the energy density of laser beam irradiation in the case where the silicon film having the film thickness distribution depicted in FIG. 11 is irradiated with a laser beam.

FIG. 12 shows the shape of change in energy density of laser beam irradiation in the case where the laser beam 11 shown in FIG. 2 is scanned (moved) from a side with a small x value to a side with a large x value in FIG. 4. This change in energy density is executed by the variable attenuator 2a shown in FIG. 1. In FIG. 12, the energy density (vertical axis) is expressed as relative transmittance of the attenuator 2a in the case where the energy density in the central portion is regarded as 100%.

Figure 11:
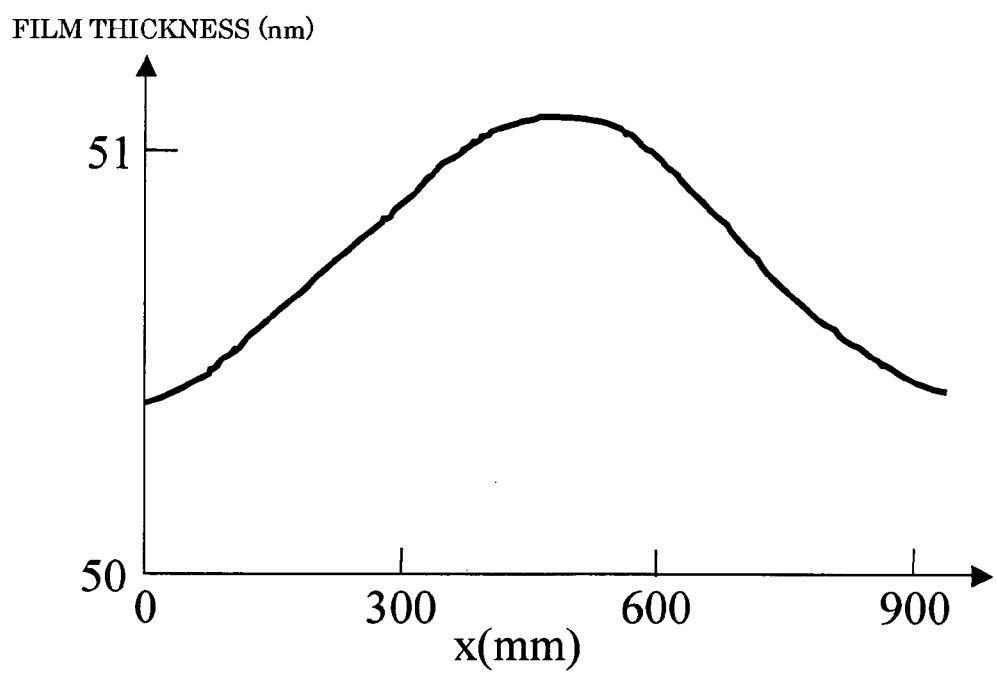
FIG. 11 is an explanatory graph showing the film thickness distribution in an x direction, of the silicon film formed on the substrate.

The amount of change in energy density in the substrate surface in FIG. 12 is set at 0.6% in terms of transmittance of the attenuator in accordance with a film thickness change of 0.6 nm in FIG. 11. Although the distribution in FIG. 11 is shaped like a curve, the energy density of laser beam irradiation is regarded as changing linearly as shown in FIG. 12 in order to simplify the mechanical operation of the variable attenuator 2a. The distribution in FIG. 11 can be approximated sufficiently by the distribution in FIG. 12.

Although FIGS. 3, 6 and 8 use crystal grain size, it is a matter of course that the same effect as described above can be obtained also in the case where a parameter value such as light reflectance before conversion into grain size is used.

When one CVD chamber is used for producing amorphous silicon films, there are most cases where the film thickness distribution in each substrate surface does not change so much for several days. This is because the plasma distribution in the chamber is mainly decided on the basis of the shape and state of electrodes. Accordingly, a sufficient effect can be obtained when the film thickness distribution is measured for only one substrate before a large number of substrates are annealed. The shape of change in energy density as shown in FIG. 12 may be generated on the basis of the measured result of the film thickness distribution on only one substrate.

As described above, in accordance with the invention, a polysilicon film with a large grain size can be produced even in the case where the difference between the maximum film thickness and the minimum film thickness in the substrate surface is large.

[Sixth Embodiment]

Figure 13:
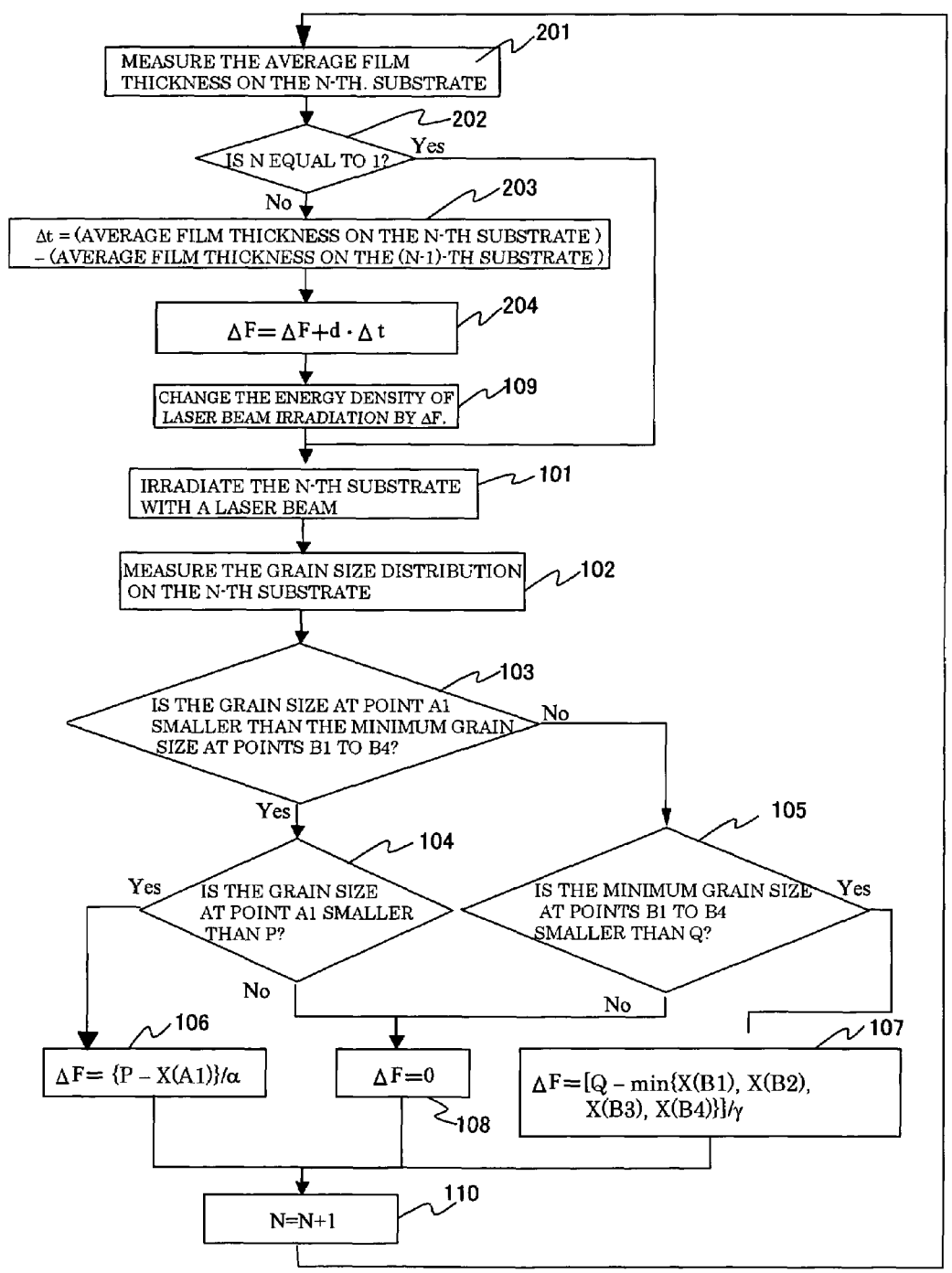
FIG. 13 is a flow chart showing algorithm for adjusting the energy density of laser beam irradiation to be applied on the silicon film on the substrate in consideration of film thickness.

A sixth embodiment of the invention will be described with reference to FIG. 13. FIG. 13 is a flow chart showing this embodiment. In this embodiment, correction due to the film thickness is added to the flow chart shown in FIG. 10. As described above in the fifth embodiment, the film thickness distribution in the substrate surface little varies according to each substrate but the average film thickness on the whole of the substrate varies widely according to each substrate. This is because the average plasma density in the chamber is affected by slight change in discharge voltage.

Therefore, in this embodiment, the energy density of laser beam irradiation is changed in accordance with change in average film thickness in each substrate surface. Because the in-plane film thickness distribution in each substrate surface does not change so much, a sufficiently accurate average film thickness can be obtained when film thicknesses measured at about 10 points in the substrate surface are averaged. Accordingly, it is unnecessary to measure all points in the whole surface of the substrate. According to this method, the time required for measuring film thicknesses is sufficiently shorter than the time required for crystallization, so that lowering of throughput can be avoided even in the case where the measurement is made for each substrate.

A flow of measurement will be described below. The grain size distribution is measured for a substrate after beam irradiation to obtain the feedback amount ΔF in the same manner as in the fourth embodiment and FIG. 10.

In addition to this, in this embodiment, the average film thickness is measured for each substrate before beam irradiation (step 201). In the second substrate or a substrate after the second substrate from the start of a crystallizing operation (No in step 202), the difference Δt between the average film thickness in the substrate surface and the average film thickness in the substrate surface previously irradiated with the beam is calculated (step 203). A value affected by the difference Δt is added to the feedback amount ΔF (step 204). In FIG. 13, d is a film thickness-dependent coefficient of energy density.

In each substrate and each silicon film used in this embodiment, d is 1%/nm as described above in the fifth embodiment. The next step 109, the step 101 to 108 following the step 109 and the step 110 are equivalent to those described in the fourth embodiment and FIG. 10.

A polysilicon film is produced by a method using the algorithm described in this embodiment in combination with control of the energy density of laser beam irradiation as a effect of the in-plane film thickness distribution in the substrate surface described above in the fifth embodiment. It has been found that when an amorphous silicon film produced by a general CVD apparatus is polycrystallized, crystal with a grain size of 0.4 µm or larger can be obtained in a region occupying 95% or larger in the substrate with a size of 730 mm by 920 mm by the aforementioned method.

As described above, in accordance with the invention, a polycrystalline film having the grain size always kept large can be produced even in the case where the film thickness on each substrate varies.

[Seventh Embodiment]

Figure 14:
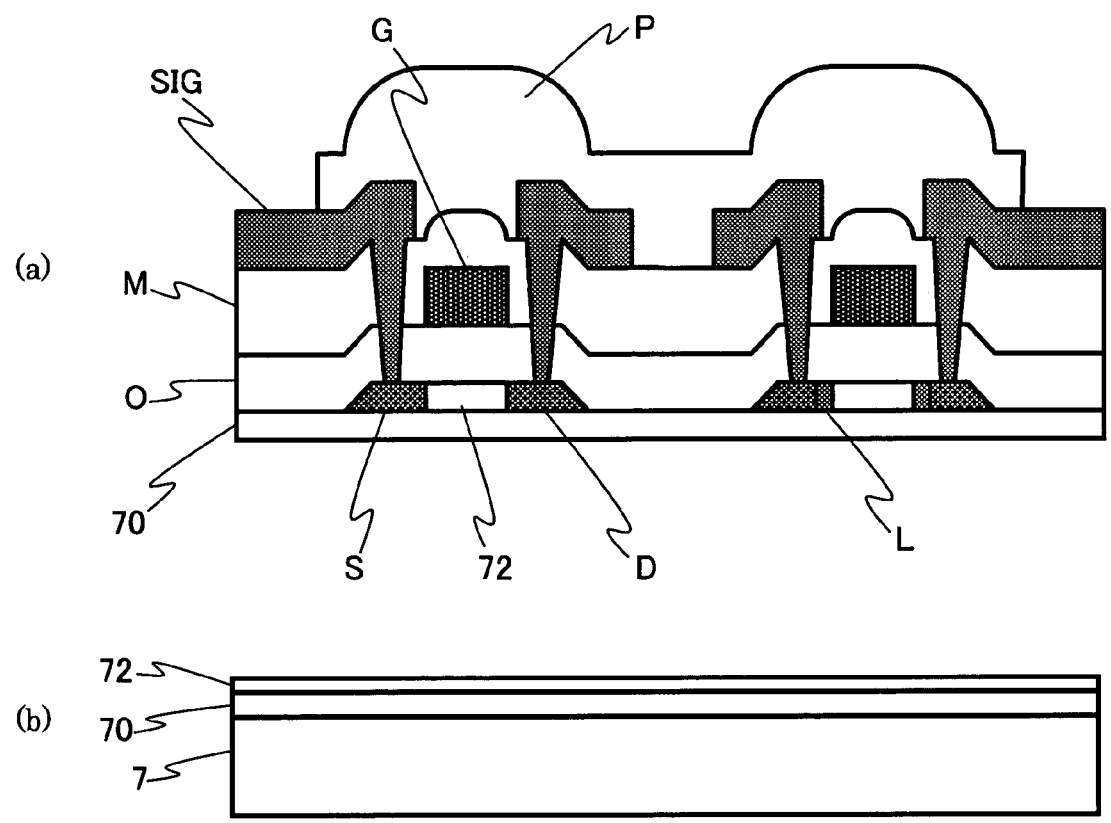
FIG. 14A is a sectional view showing the configuration of a thin-film transistor according to the invention.
FIG. 14B is a sectional view showing the middle stage of formation of the thin-film transistor for explaining a state after completion of annealing based on laser beam irradiation.

A seventh embodiment of the invention will be described with reference to FIGS. 14A and 14B and FIGS. 15A and 15B. FIG. 14A is an enlarged sectional view showing the sectional structure of thin-film transistors used in a liquid crystal display. A left half of FIG. 14A shows a p channel, and a right half of FIG. 14A shows an n channel. In FIG. 14A, the reference numeral 70 designates a blocking layer deposited on the glass substrate. The reference symbol S designates a source; D, a drain; and G, a gate. The reference numeral 72 designates a polysilicon film. The reference symbol L designates an LDD; O, a gate oxide film; M, an interlayer; SIG, a signal line; and P, a passivation. FIG. 14B is a sectional view in the stage in which the polysilicon film 72 shown in FIG. 14A is formed. In FIG. 14B, the reference numeral 7 designates a substrate; 70, a substrate; and 72, a polysilicon film.

The polysilicon film 72 is produced as follows. First, an amorphous silicon film is formed by a CVD method. An excimer laser beam is applied on the amorphous silicon film to crystallize the amorphous silicon film. In this manner, the polysilicon film 72 is produced. For the polycrystallization, while the grain size distribution in the substrate surface is fed back to the energy density of laser beam irradiation in accordance with the control method described in the sixth embodiment and FIG. 13, the energy density of laser beam irradiation is controlled in accordance with change in film thickness in each substrate surface and the film thickness distribution in the substrate surface.

Figure 15:
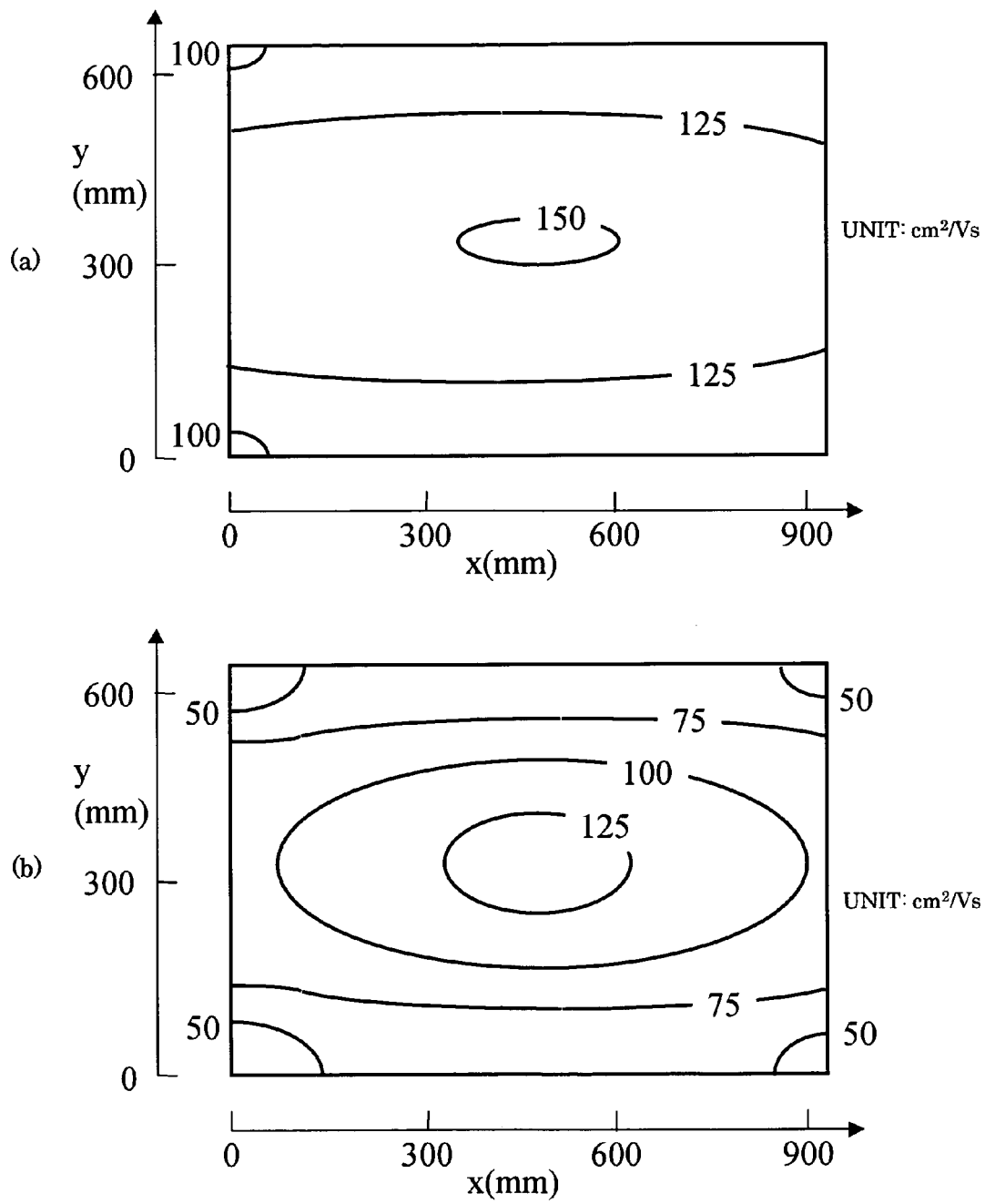
FIG. 15A is a graph of the in-plane mobility distribution for explaining mobility characteristic of the thin-film transistor according to the invention.
FIG. 15B is a graph of the in-plane mobility distribution for explaining mobility characteristic of a thin-film transistor as a comparative example in which the energy density of laser beam irradiation applied on the substrate surface is not controlled.

FIG. 15A shows a mobility distribution obtained as a result of measurement of mobility in accordance with each pixel in the stage in which thin-film transistors are formed after an amorphous silicon film having the film thickness distribution shown in FIG. 4 is polycrystallized. FIG. 15B shows a mobility distribution as reference data in the case where the polysilicon film 72 is produced without the aforementioned control of the energy density of beam irradiation.

In FIG. 15A, the in-plane average mobility is 130 cm$^2$/Vs, the standard deviation is 20 cm$^2$/Vs, and a region with mobility of 100 cm$^2$/Vs or higher occupies 96% of the whole surface. On the contrary, in FIG. 15B, the in-plane average mobility is 90 cm$^2$/Vs, the standard deviation is 40 cm$^2$/Vs, and a region with mobility of 100 cm$^2$/Vs or higher occupies 45% of the whole surface.

As described above, it is apparent that control of the energy density of laser beam irradiation in the invention is remarkably effective in improving mobility and reducing in-plane variation in mobility. Particularly, because of the in-plane film thickness distribution of the amorphous silicon film, the polysilicon film 72 has a film thickness distribution even in the stage in which the amorphous silicon film is polycrystallized for forming pixels. It has been found that a region having a crystal grain size of 0.4 µm or larger and having mobility of 100 cm$^2$/Vs or higher can occupy 95% or larger in terms of pixel number ratio regardless of the film thickness distribution of the polysilicon film 72.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications with a fall within the ambit of the appended

FIG. 3

CRYSTAL GRAIN SIZE

ENERGY DENSITY OF LASER BEAM IRRADIATION

FIG. 4

Figure 5:
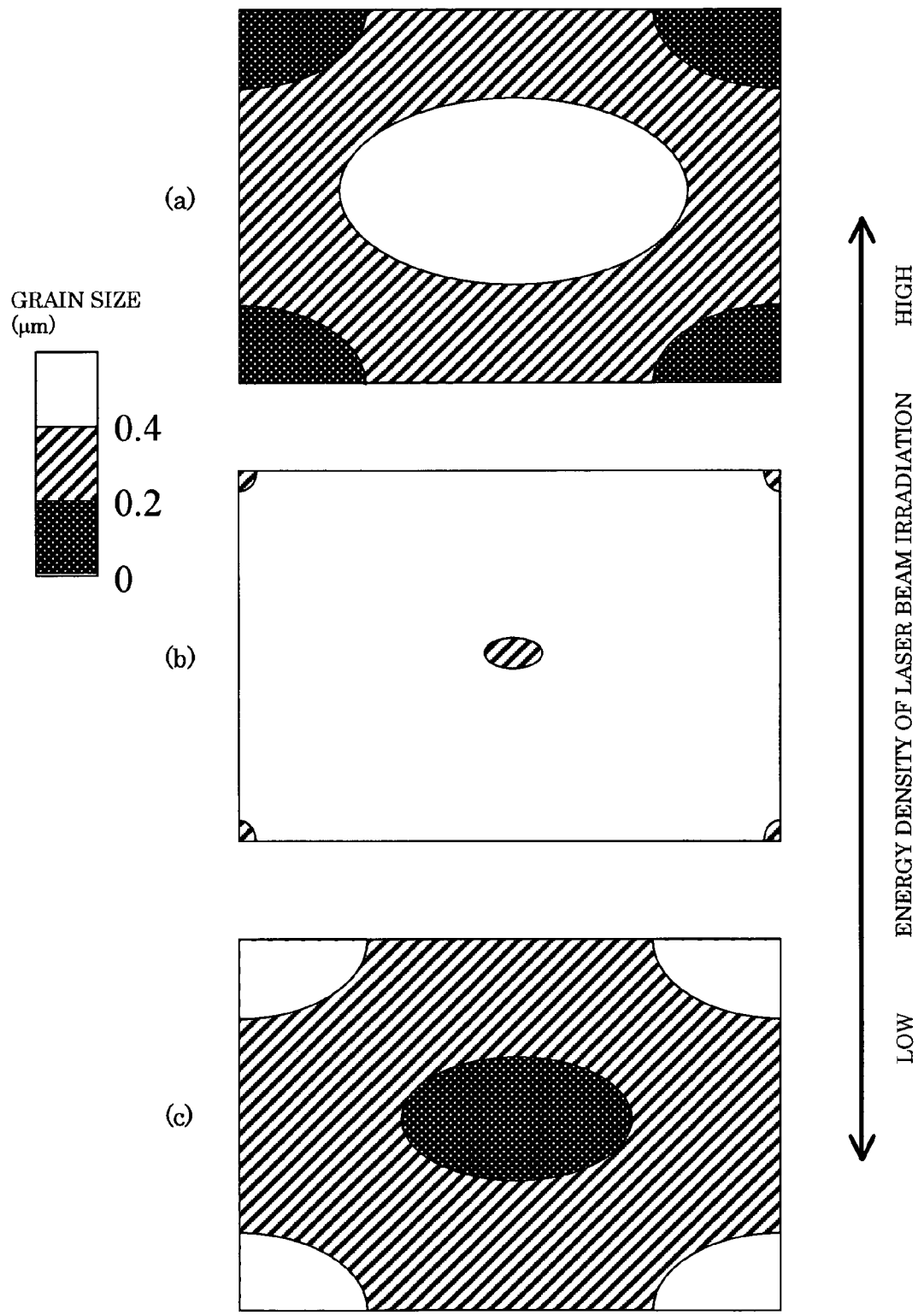
FIGS. 5A to 5C are explanatory graphs showing the crystal grain size distribution of a silicon film in the case where the silicon film is annealed while the energy density of laser beam irradiation is changed variously.
Figure 6:
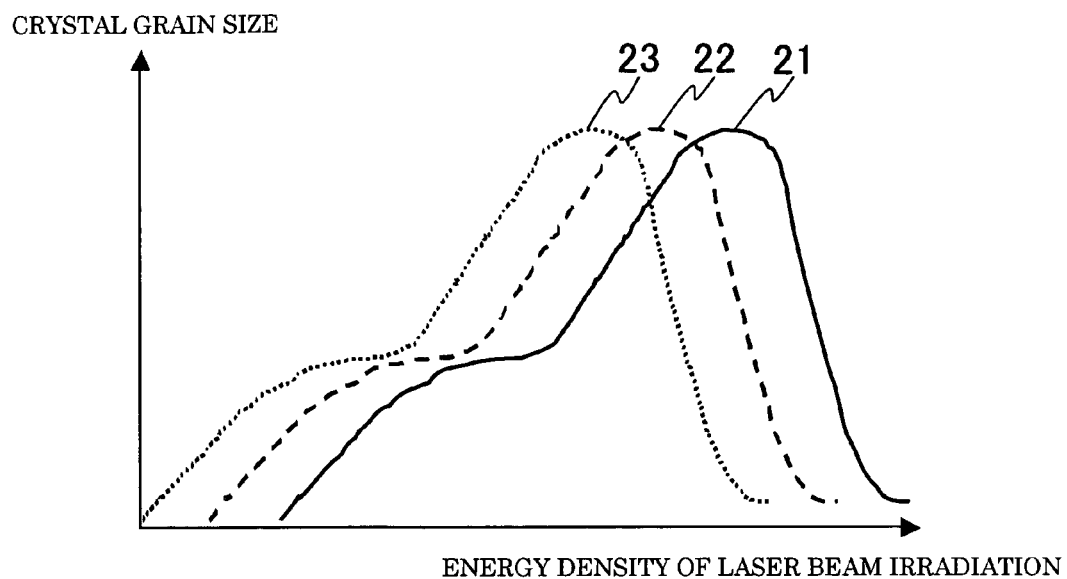
FIG. 6 is a correlation graph for explaining the relation between the energy density of laser beam irradiation and the crystalline state depending on the location in the substrate surface.

FIG. 5
  GRAIN SIZE (μm)
  ENERGY DENSITY OF LASER BEAM IRRADIATION
  UNIT: nm
  HIGH, LOW
FIG. 6
  CRYSTAL GRAIN SIZE
  ENERGY DENSITY OF LASER BEAM IRRADIATION
FIG. 8
  CRYSTAL GRAIN SIZE
  ENERGY DENSITY OF LASER BEAM IRRADIATION
  SLOPE=γ
  SLOPE=α
  MINIMUM AT POINTS B1 to B4
FIG. 9
  CRYSTAL GRAIN SIZE
  ENERGY DENSITY OF LASER BEAM IRRADIATION
  SLOPE=γ
  SLOPE=α
  MINIMUM AT POINTS B1 to B4
FIG. 10
  101: IRRADIATE THE N-TH SUBSTRATE WITH A LASER BEAM.
  102: MEASURE THE GRAIN SIZE DISTRIBUTION ON THE N-TH SUBSTRATE.
  103: IS THE GRAIN SIZE AT POINT A1 SMALLER THAN THE MINIMUM GRAIN SIZE AT POINTS B1 TO B4?
  104: IS THE GRAIN SIZE AT POINT A1 SMALLER THAN P?
  105: IS THE MINIMUM GRAIN SIZE AT POINTS B1 TO B4 SMALLER THAN Q?
  106: $\Delta F=\{P-X(A1)\}/\alpha$
  107: $\Delta F=[Q-\min\{X(B1), X(B2), X(B3), X(B4)\}]/\gamma$
  108: $\Delta F=0$
  109: CHANGE THE ENERGY DENSITY OF LASER BEAM IRRADIATION BY ΔF.
  110: N=N+1
FIG. 11
  FILM THICKNESS (nm)
FIG. 12
  ENERGY DENSITY OF LASER BEAM IRRADIATION (RELATIVE %)
FIG. 13
  201: MEASURE THE AVERAGE FILM THICKNESS ON THE N-TH SUBSTRATE.
  202: IS N EQUAL TO 1?
  203: Δt=(AVERAGE FILM THICKNESS ON THE N-TH SUBSTRATE)−(AVERAGE FILM THICKNESS ON THE (N−1)-TH SUBSTRATE)
  204: $\Delta F=\Delta F+d\cdot\Delta t$
  109: CHANGE THE ENERGY DENSITY OF LASER BEAM IRRADIATION BY ΔF.
  101: IRRADIATE THE N-TH SUBSTRATE WITH A LASER BEAM.
  102: MEASURE THE GRAIN SIZE DISTRIBUTION ON THE N-TH SUBSTRATE.
  103: IS THE GRAIN SIZE AT POINT A1 SMALLER THAN THE MINIMUM GRAIN SIZE AT POINTS B1 TO B4?
  104: IS THE GRAIN SIZE AT POINT A1 SMALLER THAN P?
  105: IS THE MINIMUM GRAIN SIZE AT POINTS B1 TO B4 SMALLER THAN Q?
  106: $\Delta F=\{P-X(A1)\}/\alpha$
  107: $\Delta F=[Q-\min\{X(B1), X(B2), X(B3), X(B4)\}]/\gamma$
  108: $\Delta F=0$
  110: N=N+1
FIG. 15A
  UNIT: $cm^2/Vs$
FIG. 15B
  unit: $cm^2/Vs$

We claim:

1. A method of producing display devices, comprising:
   a first step of forming an amorphous semiconductor film on a substrate entirely;
   a second step of irradiating the amorphous semiconductor film with a laser beam so as to polycrystallize the amorphous semiconductor film into a polycrystalline film; and
   a third step of measuring grain sizes of said polycrystalline film,
   at each of a plurality of measurement points set in a plane of the polycrystalline film in an identical order for said substrate and any subsequent substrates, said measurement points are set in a region A located at a center of the substrate, a region B located at a corner of the substrate, and a region C located around the region A so as to space the region B from the region A, respectively,
   wherein an energy density of a laser beam with which a subsequent substrate is irradiated during the second step is adjusted
   (1) to be lower than an energy density of the laser beam with which the substrate is irradiated, if a grain size measured in the region A of the substrate is larger than a grain size measured in the region B thereof;
   (2) to be higher than the energy density of the laser beam with which the substrate is irradiated, if the grain size measured in the region A of the substrate is smaller than the grain size measured in the region B thereof; or
   (3) to be identical with the energy density of the laser beam with which the substrate is irradiated, if the grain size measured in the region A of the substrate has the same value as that measured in the region B thereof.

2. A method of producing display devices according to claim 1, wherein said laser beam is emitted from an excimer laser, or a solid state laser.

3. A method of producing display devices according to claim 1, wherein said amorphous film is an amorphous silicon film.

4. A method of producing display devices according to claim 1, wherein in said third step, the measurement of the grain sizes is carried out on the basis of any one of the intensity of light diffraction, a Raman spectrum, an SEM image, an optical microscopic image, light reflectance, the intensity of light scattering and the life of a photo carrier.

5. A method of producing display devices according to claim 1, wherein:
   said second step includes a step of scanning said substrate with a light beam; and
   in said second step of, the energy density of said laser beam is adjusted along a scanning direction in accordance with a thickness of the amorphous semiconductor film which is thinner on a periphery of the substrate than on the center thereof.

6. A method of producing display devices according to claim 1, wherein the energy density of the laser beam with which the substrate is irradiated is decided on the basis of thickness distribution of the amorphous semiconductor film in the second step.

7. A method of producing display devices according to claim 1, wherein:
said amorphous semiconductor film is produced by a CVD method in
said first step.

8. A method of producing display devices according to claim 1, wherein said regions A and B in the substrate are set respectively by use of an optimum energy density derived from steps of:
polycrystallizing amorphous semiconductor films formed on a plurality of reference substrates respectively by laser beam irradiations different from each other in energy density; and
defining the optimum energy density as an energy density of the laser beam irradiation by which an average grain size of the polycrystallized semiconductor film on the whole of one of the reference substrates indicates the maximum value in comparison with those on the remaining reference substrates,
wherein a region in the substrate corresponding to a part of the polycrystallized semiconductor film formed on one of the remaining reference substrates in which the crystal grain size is minimized by the laser beam irradiation at an energy density lower than the optimum energy density is set as the region A, while another region in the substrate corresponding to a part of the polycrystallized semiconductor film formed on another of the remaining reference substrates in which the crystal grain size is minimized by the laser beam irradiation at an energy density higher than the optimum energy density is set as the region B.

9. A method of producing display devices according to claim 1, wherein:
the energy density of said laser beam with which said subsequent substrate is irradiated during the second step is adjusted in accordance with an amount of change therein obtained by use of a lower limit P of the grain size in the region A and a lower limit Q of the grain size in the region B each of which is set in advance, and
the amount of change in the energy density of the laser beam is obtained on the basis of the difference between the grain size in the region A and the lower limit P, when the grain size in the region A is smaller than the lower limit P, whereas the amount of change therein is obtained on the basis of the difference between the grain size in the region B and the lower limit Q, when the grain size in the region B is smaller than the lower limit Q.

10. A method of producing display devices according to claim 1, wherein the grain size in each of the regions A and B is obtained as a minimum value or an average value of grain sizes measured in a plurality of the measurement points provided in each of the regions A and B.

11. A method of producing display devices according to claim 1, wherein the region A is set in a region of said substrate where the amorphous semiconductor film is thick, while the region B is set in another region of said substrate where the amorphous semiconductor film is thin.

* * * * *